(12) United States Patent
Suryakumar

(10) Patent No.: US 7,586,192 B2
(45) Date of Patent: Sep. 8, 2009

(54) ROUTING CONFIGURATION FOR HIGH FREQUENCY SIGNALS IN AN INTEGRATED CIRCUIT PACKAGE

(75) Inventor: Mahadevan Suryakumar, Gilbert, AZ (US)

(73) Assignee: Intel Corporation, Santa Clara, CA (US)

( * ) Notice: Subject to any disclaimer, the term of this patent is extended or adjusted under 35 U.S.C. 154(b) by 522 days.

(21) Appl. No.: 11/085,970

(22) Filed: Mar. 21, 2005

(65) Prior Publication Data

US 2006/0208355 A1    Sep. 21, 2006

(51) Int. Cl.
*H01L 23/34*    (2006.01)

(52) U.S. Cl. ............... 257/728; 257/724; 257/E21.575

(58) Field of Classification Search ........... 257/728, 257/724, E23.143, E23.001, E23.141–E23.144, 257/146, 169, 175, E21.575, 641, 627
See application file for complete search history.

(56) References Cited

U.S. PATENT DOCUMENTS 3,876,964 A  *  4/1975  Balaster et al. ............. 333/238
5,239,448 A  *  8/1993  Perkins et al. ............. 361/764
6,441,790 B1 *  8/2002  Forrester et al. ............ 343/702
6,650,456 B2 * 11/2003  Judd et al. .................. 359/245

OTHER PUBLICATIONS

Singh, et al., "Parasitic Modeling and Noise Mitigation in Advanced RF/Mixed-Signal Silicon Germanium Process," IEEE Transactions on Electron Devices, vol. 50, No. 3, Mar. 2330, pp. 700-717.
Grabois, Mike, "Crosstalk Vexes Interface Designs," EETimes, Apr. 2, 2001, www.eetimes.com/article/showArticle.jhtml?articleId=12805591, 4 pages.
Brewer, Ron, "Signal Integrity—A New Name for an Old Problem . . . ," http://personal.lig.bellsouth.net/b/r/brewerrw/ArtSig.html, Copyright 2003, 4 pages.

* cited by examiner

*Primary Examiner*—Thinh T Nguyen
(74) *Attorney, Agent, or Firm*—Blakely, Sokoloff, Taylor & Zafman LLP

(57) ABSTRACT

An apparatus for routing a high-speed signal is disclosed, having a signal router and a plurality of projections extending therefrom. The projections are separated from each other by a distance between about 0.25 and 0.125 of λgo, wherein λgo is a guide wavelength at cut-off frequency of the first signal transmitting element.

18 Claims, 4 Drawing Sheets

ROUTING CONFIGURATION FOR HIGH FREQUENCY SIGNALS IN AN INTEGRATED CIRCUIT PACKAGE

FIELD OF THE INVENTION

The present invention relates to a system for routing a high frequency signal in an integrated circuit package.

BACKGROUND OF THE INVENTION

Integrated circuits, such as microprocessors, are formed on semiconductor wafers, which are then sawed into individual semiconductor chips, also known as microelectronic dies. Each resulting die is then mounted on a package substrate, and the package substrate is then mounted on a motherboard. The package substrate provides structural integrity for communication with the die.

The package substrate often has a number of Ball Grid Array (BGA) solder ball contact formations on an opposing side, which are electrically connected to the integrated circuit through vias and signal routers in and on the package substrate between the integrated circuit and the motherboard.

In existing assemblies of the above kind, on-die device parasitic capacitance and package substrate parasitic inductance result in a low bandwidth for high-speed buses due to reduced signal quality at the driver and receiver circuits. At a high signaling bit rate (e.g., 15 GHz and above), a 3×-4× reduction of on-die device parasitic capacitance is required to provide the required bandwidth of the high-speed bus. Additionally, as a result of this parasitic capacitance and inductance, there are undesirable deviations, such as crosstalk, wherein the waveform on a trace couples with an adjacent trace. Crosstalk causes smaller signal amplitudes and degraded transition times, making it more difficult to determine the correct phase for each particular signal. Parasitic capacitance also interacts with inductance planes in the package substrate to create resonance which results in return loss, preventing higher frequencies and reducing signal quality.

BRIEF DESCRIPTION OF THE DRAWINGS

The invention is described by way of example with reference to the accompanying drawings, wherein.

DETAILED DESCRIPTION OF THE PREFERRED EMBODIMENTS

Figure 1:
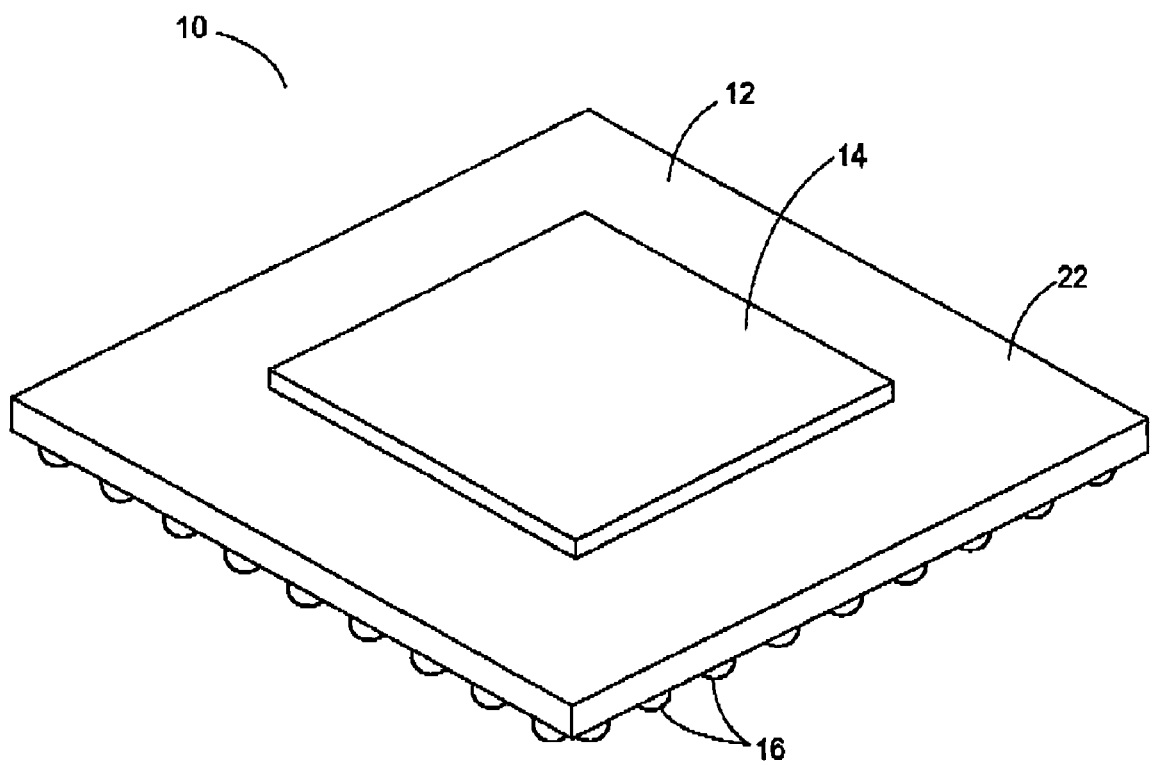
FIG. 1 is a perspective view of an electronic assembly that may have features according to an embodiment of the invention.
Figure 2:
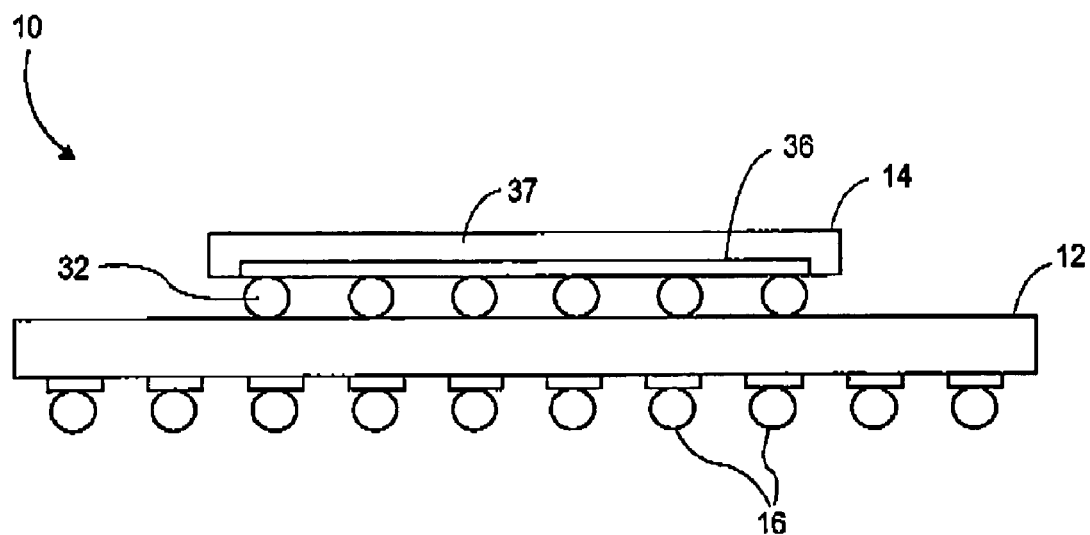
FIG. 2 is a cross-sectional side view of the electronic assembly of FIG. 1.

FIGS. 1 and 2 illustrate a semiconductor package 10 that may have features according to an embodiment of the invention, including a package substrate 12, a microelectronic die 14, and a plurality of contact formations 16.

The package substrate 12 has a top surface 22 and a bottom surface 24 and a plurality of alternating conducting and insulating layers therein.

The microelectronic die 14 is mounted on the top surface 22 of the package substrate 12 at a central portion thereof. The microelectronic die 14 includes an integrated circuit 36 formed in and on a semiconductor substrate 37. The integrated circuit 36 includes a multitude of electronic components, such as transistors, capacitors, diodes, and the like, and a plurality of alternating insulating and conductive metal layers over the electronic components. The conductive layers are patterned to interconnect the electronic components and so complete the circuit 36. The integrated circuit may for example be a microprocessor.

The package 10 includes signal transmitting elements (not shown) that transmit signals between the integrated circuit located in the microelectronic die 14 and driver and receiver circuitries located on the package substrate 12. These signal transmitting elements include differential pairs of signal routers. Each differential pair includes a first signal router that transmits current in one direction and a second signal router that runs parallel to the first signal router to complete a circuit and allow the current to return.

In accordance with the present invention, the resonant frequency of the traces is increased well above the signaling frequency range in order to accurately transmit a high-frequency signal. The equation for resonant frequency, f, is:

$$f = \frac{1}{2\pi\sqrt{LC}}$$

wherein,
L is inductance and
C is capacitance.

Figure 3:
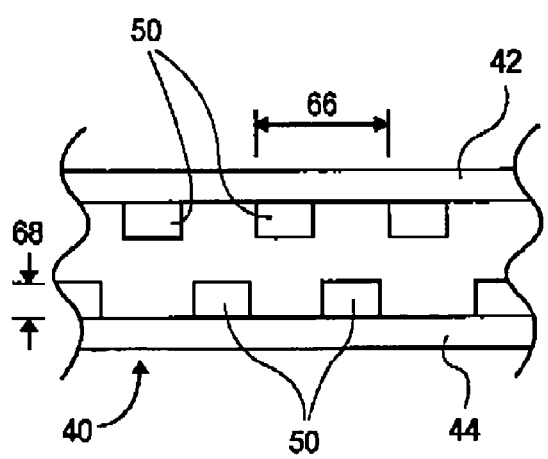
FIG. 3 is a top plan view of one differential pair of signal routers in a package substrate of the electronic assembly of FIG. 1.

Referring to FIG. 3, one differential pair 40 is shown having a first trace 42, a second trace 44, and a plurality of projections 50, in accordance with one embodiment of the present invention. The second trace 44 is parallel to the first trace 42.

Each of the traces 42 and 44 has a rectangular cross-section with a width 60 of 28 μm and a thickness 62 of 15 μm. The first trace 42 and the second trace 44 are separated by a distance 64 of 56 μm.

The projections 50 extend from each of the first and second traces 42, 44. The projections 50 on the first trace 42 extend from the side of the first trace adjacent to the second trace 44, and the projections on the second trace 44 extend from the side of the second trace adjacent the first trace 42. The projections 50 are arranged interjacently, such that each projection 50 on the first trace is between two projections on the second trace 44.

The projections 50 are equidistantly spaced along the length of each of the traces 42, 44. The projections 50 are desirably spaced such that the harmonic passband for the fundamental mode is at a very high frequency. A distance 66 between each of the projections 50 may be any value or range of values between about $$\frac{\lambda_{go}}{4}$$

and about $$\frac{\lambda_{go}}{8},$$

wherein $\lambda_{go}$ is the guide wavelength at cut-off frequency of the traces 42 and 44.

The actual number of projections 50 extending from each of the traces 42, 44 depends on the length of the trace and the distance between each of the projections 50. The shape of the projections 50 is square, for example, with side lengths 68 of 30 μm and a thickness 70 of 15 μm. The projections 50 are solid and metallic. The projections 50 are formed with the trace in the masking process.

Figure 4:
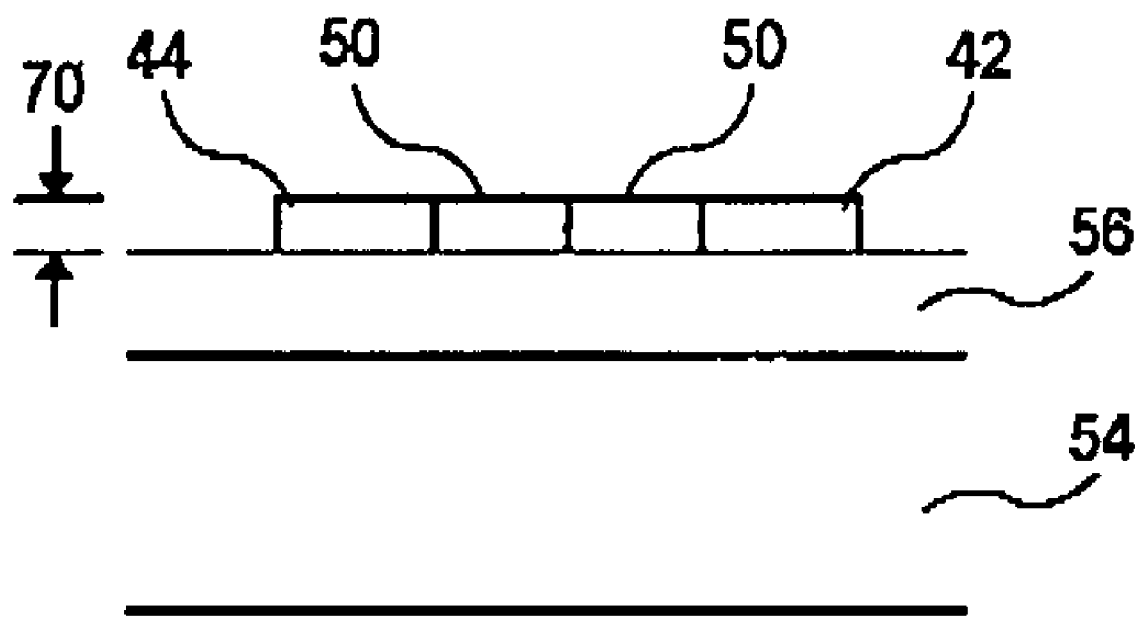
FIG. 4 is a cross-sectional end view of a portion of the package substrate.

FIG. 4 is an end view showing a ground plane 54, a dielectric material 56, and the differential pair 40. The differential pair includes a first trace 42, a second trace 44 and a plurality of projections 50 extending therefrom. The traces 42, 44 are positioned on the dielectric material 56, which is positioned on the ground plane 54.

In use, a signal is routed through the traces 42, 44 and/or trace 58 and the projections extending therefrom, connecting contacts on the carrier substrate with the integrated circuit on the die. The projections decrease the inductance and resistance of each of the traces, thereby increasing the resonant frequency of each of the traces. The projections also create a low-pass filter effect in the package substrate.

One advantage of this invention is improved bandwidth for high-speed signals. Another advantage of this invention is that the signaling frequency may be increased. Another advantage of this invention is improved signal quality. The projections also reduce return loss and cross talk by about 4.5 dB.

Other embodiments of the invention may use signal transmitting elements other than traces, such as, for example, a signal router, a rectangular waveguide, and the like. In some embodiments, the signal transmitting elements are coplanar. Other embodiments of the invention may include projections on another side of the traces, and even on all sides of the traces, as long as leakage is within acceptable limits.

Different shapes and sizes of projections may be used in other embodiments. Examples of different shapes for the projections include round, trapezoidal, triangular, rectangular, and the like. In some other embodiments, the distance between each of the projections may also be somewhat below $0.25\lambda_{go}$ or above $0.125\lambda_{go}$. Different materials may also be used for the projections.

The apparatus may be used on different types of semiconductor packages or boards. Different processes and methods of forming the projections and traces may be used.

Figure 5:
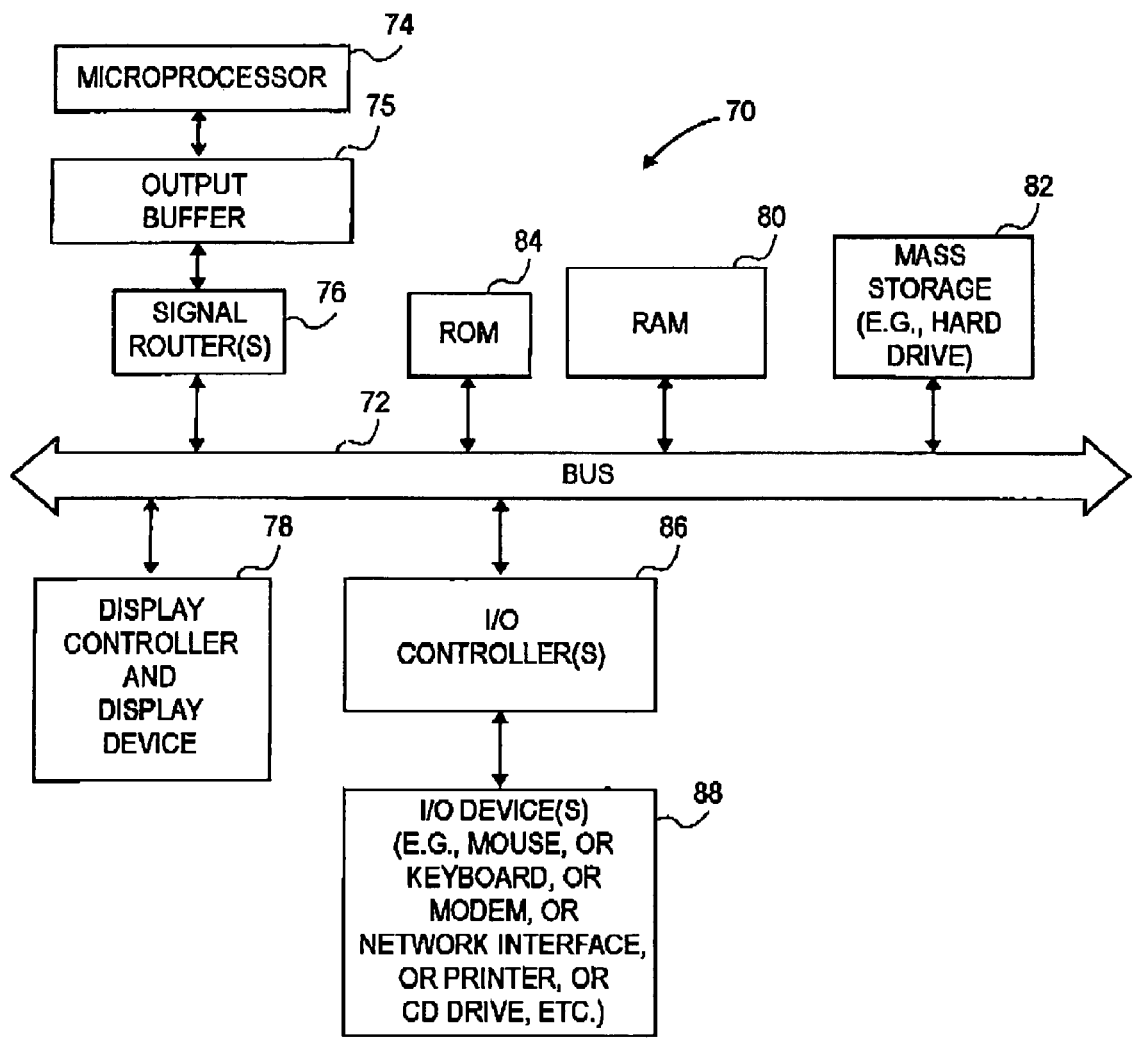
FIG. 5 is a block diagram of a computer system that has a microprocessor with features in accordance with the embodiment of FIG. 1.

FIG. 5 shows one example of a typical computer system which may be used with the present invention. As shown in FIG. 5, the computer system 70, which is a form of a data processing system, includes a bus 72 which is coupled to a microprocessor(s) 74 having an output buffer 75, through a signal router 76. The bus is also coupled to a display controller and display device 76. The bus is also coupled to a volatile RAM 80 and a non-volatile memory 82 and a ROM (Read Only Memory) 84. The bus is also coupled to peripheral devices such as input/output (I/O) devices 88 which may be mice, keyboards, modems, network interfaces, printers and other devices which are well known in the art. Typically, the input/output devices 88 are coupled to the system through input/output controllers 86. The bus 72 interconnects these various components 74, 75, 76, 78, 80, 82, 84, 86, and 88 together.

The output buffer 75 drives a low voltage swing signal into the signal router 76. In some embodiments, the output buffer 75 is a clock that provides the signal routed by the signal router 76. The signal router 76 may be implemented as a signal router as described above with reference to FIGS. 3-4. The volatile RAM (Random Access Memory) 80 is typically implemented as dynamic RAM (DRAM) which requires power continually in order to refresh or maintain the data in the memory. The mass storage device 82 is typically a magnetic hard drive or a magnetic optical drive or an optical drive or a DVD RAM or other types of memory systems which maintain data (e.g., large amounts of data) even after power is removed from the system. Typically, the mass storage device 82 will also be a random access memory although this is not required. While FIG. 5 shows that the mass storage 82 is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface.

The bus 72 may include one or more buses connected to each other through various bridges, controllers and/or adapters as is well known in the art. In one embodiment the I/O controller 86 includes a USB (Universal Serial Bus) adapter for controlling USB peripherals and an IEEE 1394 controller for IEEE 1394 compliant peripherals.

Note that while FIG. 5 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention.

Although the present invention has been described in terms of certain preferred embodiments, those skilled in the art will recognize that other and further changes and modifications may be made hereto without departing from the spirit of the invention, and it is intended to claim all such changes and modifications as fall within the true scope of the invention. Accordingly, the scope of the present invention is not to be limited by the particular embodiments described, but is to be defined only by reference to the appended claims and equivalents thereof.

What is claimed is:

1. A system comprising:
   an integrated circuit;
   a first contact;
   a first signal router, connecting the contact to the integrated circuit;
   a first plurality of projections, extending from the first signal router, the projections being spaced apart from one another;
   a second contact;
   a second signal router, connecting the second contact to the integrated circuit, the second signal router parallel to the first signal router; and
   a second plurality of projections, extending from the second signal router, the projections of the second plurality of projections being spaced apart from one another, wherein at least one of the first plurality of projections and at least one of the second plurality of projections are interjacent, and wherein the first plurality of projections and second plurality of projections are positioned such that the distance between each of the projections is any value between 0.25 and 0.125 of λgo. wherein λgo is a guide wavelength at cut-off frequency of the first and second signal routers, which form a differential pair.

2. The system of claim 1, wherein the plurality of projections are integral with the signal router.

3. The system of claim 1, wherein the first and second plurality of projections are for increasing the resonant frequency of the differential pair of first and second signal routers.

4. The system of claim 1, wherein the integrated circuit is a microprocessor.

5. The system of claim 1, wherein the first and second signal routers complete a circuit.

6. The system of claim 1, further comprising:
a die having an integrated circuit therein; and
a carrier substrate, having at least one dielectric layer and the first signal router, the die being mounted on the carrier substrate and the contact being formed on the carrier substrate.

7. The system of claim 6, wherein the die and the contact are on opposing sides of the carrier substrate.

8. The system of claim 1, further comprising an output buffer, connected to the first contact, the output buffer providing the signal at a frequency.

9. The system of claim 8, wherein the output buffer comprises a clock.

10. The system of claim 6, further comprising memory and a bus, the bus connecting the carrier substrate to the memory.

11. The system of claim 10, wherein the memory is selected from the group consisting of ROM, RAM, mass storage, and combinations thereof.

12. The system of claim 10, further comprising a display controller and display device and an I/O controller connected to at least one I/O device, the bus connecting the carrier substrate with the display controller, display device and I/O controller.

13. An apparatus comprising:
a differential pair, wherein the differential pair comprises:
a first signal transmitting element having a first plurality of projections; and
a second signal transmitting element, parallel to the first signal transmitting element, having a second plurality of projections,
wherein the first plurality of projections and second plurality of projections are positioned such that the distance between each of the projections is any value between 0.25 and 0.125 of $\lambda go$ wherein $\lambda go$ is a guide wavelength at cut-off frequency of the differential pair comprising the first and second signal transmitting elements.

14. The apparatus of claim 13, wherein at least one of the first plurality of projections and at least one of the second plurality of projections are interjacent.

15. The system of claim 13, further comprising:
a first contact;
a second contact;
an integrated circuit;
a die, the integrated circuit being formed in the die; and
a carrier substrate, having at least one dielectric layer and the first and second signal transmitting elements, the die being mounted on the carrier substrate, the first and second contacts being formed on the carrier substrate, the first signal transmitting element connecting the first contact to the integrated circuit and the second transmitting element connecting the second contact to the integrated circuit.

16. The system of claim 15, further comprising:
a memory; and
a bus, the bus connecting the carrier substrate to the memory.

17. The system of claim 16, wherein the memory is selected from the group consisting of ROM, RAM, mass storage, and combinations thereof.

18. The system of claim 15, further comprising a display controller and display device and an I/O controller connected to at least one I/O device, the bus connecting the carrier substrate with the display controller, display device and I/O controller.

* * * * *

UNITED STATES PATENT AND TRADEMARK OFFICE
CERTIFICATE OF CORRECTION

PATENT NO. : 7,586,192 B2 Page 1 of 1
APPLICATION NO. : 11/085970
DATED : September 8, 2009
INVENTOR(S) : Mahadevan Suryakumar It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 589 days.

Signed and Sealed this

Fourteenth Day of September, 2010

David J. Kappos
*Director of the United States Patent and Trademark Office*